United States Patent
Neic

(10) Patent No.: US 9,664,742 B2
(45) Date of Patent: May 30, 2017

(54) METHOD AND DEVICE FOR MEASURING A CURRENT FLOWING THROUGH A SWITCH

(71) Applicant: CONTINENTAL AUTOMOTIVE GMBH, Hannover (DE)

(72) Inventor: Aurel-Vasile Neic, Kasten Bei Boeheimkirchen (AT)

(73) Assignee: Continental Automotive GmbH, Hannover (DE)

( * ) Notice: Subject to any disclaimer, the term of this patent is extended or adjusted under 35 U.S.C. 154(b) by 56 days.

(21) Appl. No.: 14/435,965

(22) PCT Filed: Oct. 14, 2013

(86) PCT No.: PCT/EP2013/071383
§ 371 (c)(1),
(2) Date: Apr. 15, 2015

(87) PCT Pub. No.: WO2014/060330
PCT Pub. Date: Apr. 24, 2014

(65) Prior Publication Data
US 2015/0268303 A1    Sep. 24, 2015

(30) Foreign Application Priority Data
Oct. 15, 2012   (DE) ........................ 10 2012 218 773

(51) Int. Cl.
*G01R 31/327*   (2006.01)
*G01R 19/00*   (2006.01)
(Continued)

(52) U.S. Cl.
CPC ..... *G01R 31/3277* (2013.01); *G01R 19/0015* (2013.01); *G01R 19/0092* (2013.01);
(Continued)

(58) Field of Classification Search
CPC ................................ G01R 27/08; G01R 27/14
See application file for complete search history.

(56) References Cited

U.S. PATENT DOCUMENTS 2,585,121 A * 2/1952 Hartman .............. G01R 31/026
324/71.6
4,804,903 A    2/1989 Yundt
(Continued)

FOREIGN PATENT DOCUMENTS

CN          2600819 Y      1/2004
CN        101860001 A     10/2010
(Continued)

OTHER PUBLICATIONS

Forghani-Zadeh, H. Pooya, et al., "An Accurate, Continuous, and Lossless Self-Learning CMOS Current-Sensing Scheme for Inductor-Based DC-DC Converters," IEEE Journal of Solid-State Circuits, IEEE Service Center, Piscataway, NJ, USA, Bd. 42, Nr. 3, Mar. 1, 2007 (Mar. 1, 2007), Seiten 665-679, XP011171988.

*Primary Examiner* — Clayton E Laballe
*Assistant Examiner* — Noam Reisner
(74) *Attorney, Agent, or Firm* — Laurence A. Greenberg; Werner H. Stemer; Ralph E. Locher

(57) ABSTRACT

A method and a device for measuring a current flowing through a switch which has an unknown inner resistance and two connections, a voltage difference being measured at the switch. During operation, the current provided by an AC voltage source, which is part of an AC voltage circuit connected in parallel with the switch, is superimposed on the current to be measured, the current flowing through the switch, by way of the AC voltage source. Both the amplitude and the frequency of the current provided by the AC voltage source are known. An AC voltage component of the voltage difference and the amplitude of the component are ascertained, and the current between the connections is ascer-
(Continued)

tained and output proportionally to the amplitude of the current of the AC voltage source.

20 Claims, 12 Drawing Sheets

(51) Int. Cl.
  *G01R 19/10* (2006.01)
  *G01R 19/165* (2006.01)
  *G01R 19/22* (2006.01)
(52) U.S. Cl.
  CPC ....... *G01R 19/10* (2013.01); *G01R 19/16542* (2013.01); *G01R 19/22* (2013.01)

(56) References Cited

U.S. PATENT DOCUMENTS

| | | | |
|---|---|---|---|
| 5,804,979 A * | 9/1998 | Lund | G01R 1/203 324/126 |
| 6,091,223 A | 7/2000 | Rogers et al. | |
| 6,313,612 B1 * | 11/2001 | Honda | G04C 10/00 320/139 |
| 6,400,163 B1 * | 6/2002 | Melcher | G01R 31/3277 324/126 |
| 8,461,845 B2 | 6/2013 | Benabdelaziz et al. | |
| 2001/0046145 A1 | 11/2001 | Oknaian et al. | |
| 2009/0140749 A1 | 6/2009 | Spah | |
| 2011/0279133 A1 | 11/2011 | Harper et al. | |
| 2014/0015513 A1 | 1/2014 | Joeckel et al. | |

FOREIGN PATENT DOCUMENTS

| | | |
|---|---|---|
| DE | 102007036837 A1 | 2/2009 |
| DE | 102007058314 A1 | 6/2009 |
| DE | 102012006269 A1 | 10/2012 |
| EP | 2107382 A1 | 10/2009 |
| WO | 2005031955 A1 | 4/2005 |

* cited by examiner

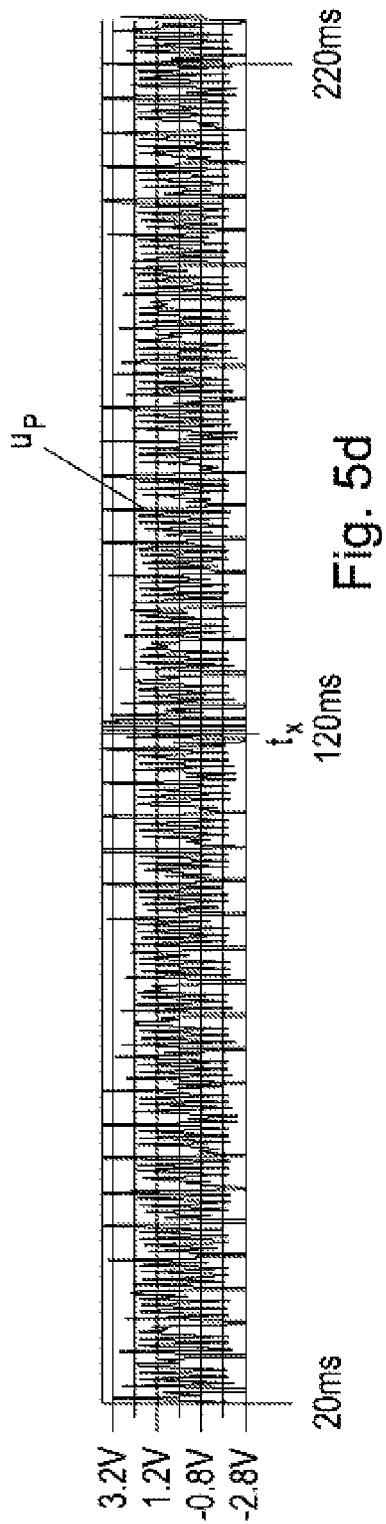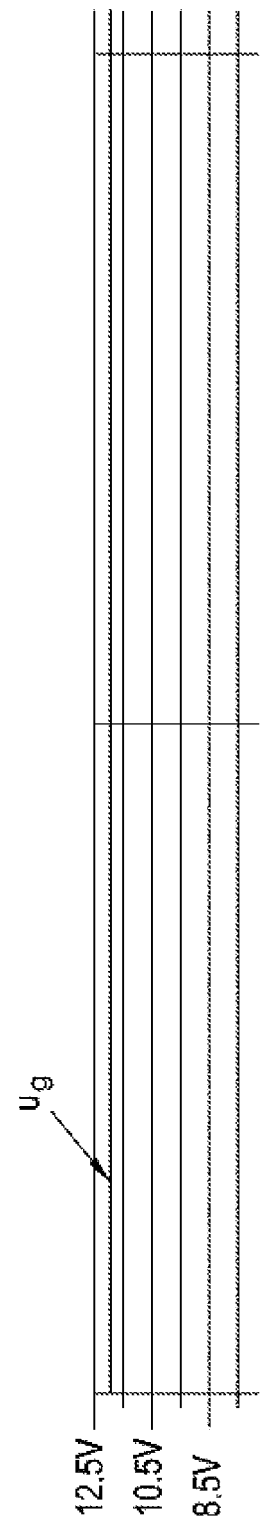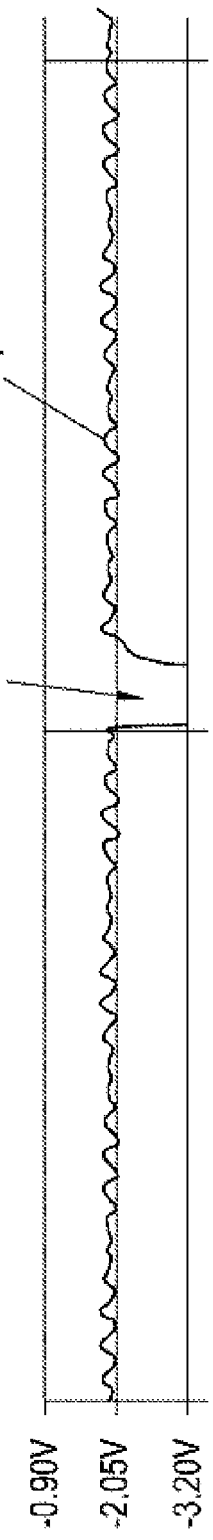

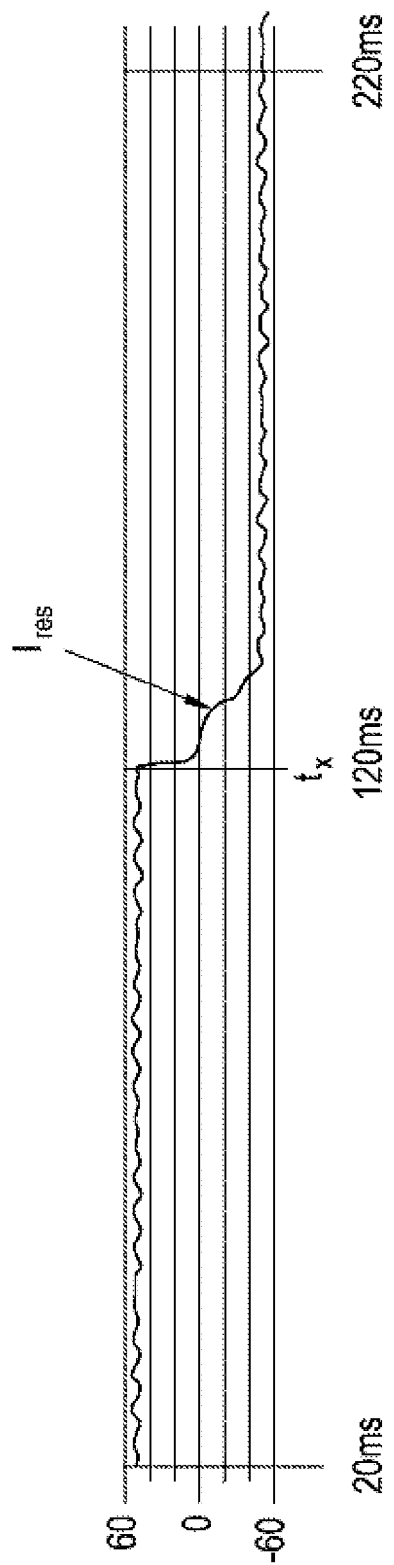

METHOD AND DEVICE FOR MEASURING A CURRENT FLOWING THROUGH A SWITCH

BACKGROUND OF THE INVENTION

Field of the Invention

The invention relates to a method and a device for measuring a current through a switch having an unknown internal resistance, said switch having two connections, wherein a voltage difference at the switch is measured using a measuring circuit for determining the voltage present at the switch.

It is known that in the case of such measurements the measurement results naturally have a significant dependence on the internal resistance of the switch which is present at the time of the measurement. Accordingly, given the same current, the measured voltages vary, for example, between switches which in principle have an identical design (and therefore the current measurements) owing to exemplary scatter and, in addition, owing to environment dependent parameters, such as temperature, for example. Generally, attempts are therefore made to take into consideration the fluctuating or varying parameters by means of calibration and temperature measurement, using a table of compensation values. In this case, however, the poor correlation between the measured temperature and the actual switch temperature has a disadvantageous effect. In situations with a plurality of switches connected in parallel, this correlation is even poorer and compensation is therefore even more difficult.

BRIEF SUMMARY OF THE INVENTION

The object of the invention therefore consists in providing a method and a device of the type mentioned at the outset in which the dependence of the measurement result on temperature and exemplary scatter is at least reduced.

The method according to the invention of the type mentioned at the outset achieves this object in that with the aid of an AC source which is part of an AC circuit connected in parallel with the switch, wherein both the amplitude and the frequency of the current provided by the AC source are known, during operation the current provided by the AC source is superimposed on the current through the switch to be measured, an AC voltage component of the voltage difference and the amplitude thereof is determined as maximum voltage value, and the current between the connections is determined proportionally to the maximum current of the AC source and is output. In the case of the corresponding device according to the invention, therefore, an AC circuit comprising an AC source, which provides an alternating current with a known amplitude and at a known frequency, is connected in parallel with the switch, wherein, during operation, the alternating current is superimposed on the current through the switch to be measured, and the measuring circuit is designed for determining an AC voltage component of the voltage present at the switch. Since the amplitude of the alternating current is known, it is possible to draw a conclusion on the present internal resistance of the switch on the basis of the amplitude of the AC voltage component, assuming a linear switch resistance, without needing to interrupt or influencing the direct current.

When a DC voltage value of the voltage difference is determined in addition to the AC voltage component, or when the measuring circuit is designed to determine a DC voltage component of the voltage present at the switch, the current between the connections can advantageously be determined from the amplitude of the alternating current of the AC source and the ratio of the determined voltage values and output, independently of the present switch resistance. Preferably, the measuring circuit has, for this purpose, at least one low pass filter for determining a DC voltage component of the voltage present at the switch. This method or this device make use of the fact that the ratio of two currents corresponds to the ratio of the two associated voltages, given the same resistance. Specifically, this technique, by virtue of superimposition of a known alternating current, provides the possibility of implicitly determining the internal resistance of the switch at the time of measurement. Any influencing factors changing this internal resistance can therefore be practically eliminated, so that they no longer influence the measurement result, or at least influence it to a much lesser degree. In order to take into consideration correctly any parameters which change over time, the determination of the DC voltage component and the determination of the AC voltage component can be implemented simultaneously.

In particular in the case of low direct currents in comparison with the amplitude of the alternating current, it is advantageous if the switch is a semiconductor switch, which is connected to a gate signal generator for controlling a switch resistance, wherein the current provided by the AC source is interrupted, the switch resistance is modulated periodically, preferably at the frequency of the AC source, by the gate signal generator, and a further AC voltage component of the voltage difference is determined, wherein the current between the connections is determined proportionally to the product of the maximum current of the AC source and the further AC voltage component and is output. A measurement of the DC component is in this case not required for determining the current between the connections, wherein the absolute internal resistance of the switch can be unknown, but the change in resistance generated by the gate signal generator must be known.

In an advantageous development of the method for measuring the current through the switch, the change in resistance also does not need to be known, but is determined over the course of the method. This development comprises the following steps:

a) a first setting of the switch resistance is selected;
b) a first AC voltage component of the voltage difference is determined;
c) a second setting of the switch resistance is selected;
d) a second AC voltage component of the voltage difference is determined;
e) the AC source is deactivated;
f) the switch resistance is switched over between the first and second settings periodically, corresponding to a square wave signal, by the gate signal generator, preferably at the same frequency that the alternating current generated previously by the AC source had;
g) a third AC voltage component of the voltage difference is determined;
h) the current between the connections is determined from a maximum current of the AC source and the ratio of the third AC voltage component and the difference between the first and second AC voltage component and is output.

For quick determination of the direction of current flow as part of one of the methods described above, an AC voltage component of the voltage difference, which AC voltage component is brought about either by superimposing an alternating current or by modulation of the switch resistance, can be multiplied by a reference signal, and the direction of current flow can be determined on the basis of the mathematical sign of the product signal and output, wherein preferably the reference signal has the same frequency as the alternating current or the switch resistance. In this variant of the invention, the phase of the AC voltage component which is effectively rotated through substantially 180° in the case of changing direction of current flow (i.e. a reversal of the mathematical sign of the DC component) and the sensitivity of the product signal with respect to phase shifts are utilized in order to identify a change in the direction of current flow usually within the first half-cycle of an oscillation. In the case of one and the same measurement, in this case the frequency of the modulation and demodulation should be identical and their phases correlated, but it is possible for different frequencies to be used in different measurement methods or measurements. If, for example, a plurality of filters are available (or a filter bank which is tunable, for example a switching capacitor filter), a measurement can be performed for one frequency, and another measurement for a second frequency.

If any frequencies which are superimposed on the current to be measured are not or barely predictable, it is advantageous if the frequency of the AC source and possibly of the gate signal generator is changed as soon as unfavorable frequency components, such as mixed products, harmonics, aliasing artifacts, etc., are identified in the current between the connections. This method is also useful when interference frequencies which are subject to great change and are sometimes so high that an AC source would already cause problems with the emission of electromagnetic waves at even higher frequencies are to be expected. In this case, it is more favorable to select a relatively low frequency and, if required, to deviate from this correspondingly, i.e. in the event of overlapping of the frequency ranges.

In order to protect the switch, but also as a protection function against fault currents, it is favorable if the switch is switched off when the determined current is greater than a predetermined limit value. In this case, the limit value is of course dependent on the respective application.

A simple possibility for determining the AC voltage component consists in providing at least one band pass filter for determining the AC voltage component of the voltage present at the switch in the measuring circuit. In particular when the filter or the transfer function thereof does not need to be configurable, relatively inexpensive component parts can be used for this.

In order to simplify the analysis of the DC and AC voltage components, it is advantageous if the measuring circuit has a differential amplifier for amplifying the voltage present at the switch. In particular, a differential amplifier enables a voltage measurement which is independent of the potential of the switch, for example within a disconnected and independently supplied circuit.

In order to enable a simple change in the switch internal resistance and to cover a particularly wide current range during the measurement, it is favorable if the switch is a semiconductor switch, which is connected to a gate signal generator for controlling a switch resistance. In this case, the internal resistance can be changed to the desired extent, or even modulated, presupposing a suitable gate signal generator, by means of corresponding settings of the gate voltage of the semiconductor switch. In addition, in the case of currents below the known AC value, it is possible for the switch resistance to be increased, and in the case of currents above the known AC value, the switch resistance can be decreased, so that a determined current range is mapped onto a voltage range which is relatively small in comparison with a constant resistance, which therefore enables the coverage of a wider current range in the case of given dynamics of the voltage measurement.

In the simplest case, the gate signal generator can have a gate voltage switch having at least two and preferably three switching states, wherein a different switch resistance is assigned to each switching state. In this case, the gate signal generator can match the switch resistance by means of application of various gate voltages. In this case, one of the possible gate voltages is advantageously selected such that the switch is substantially switched off thereby. In order nevertheless to provide a broader current range, the gate voltage switch requires at least two additional switching states for two different gate voltages, and therefore in total at least three. The switching off by means of a gate voltage can also be dispensed with, however, so that two different gate voltages are sufficient in this case.

It has been found that it is extremely advantageous, in particular in the case of measurements of considerably lower currents in comparison with the alternating current, if the gate signal generator has a clock generator for time controlled, periodic switching over between at least two different gate voltages since the current to be measured can therefore be determined from the excursion of the AC voltage component generated owing to the changing switch resistance when the AC source is switched off. In the case of suitably selected switch resistances, this excursion can be measured more easily than the DC voltage component otherwise to be measured.

In the situations in which the current to be measured is markedly lower than the current provided by the AC source, the analysis of the DC voltage component in the case of an active AC source is complex, as mentioned. If the current to be measured is converted into an AC voltage at a known frequency, however, as a result of periodically varying the switch resistance, as mentioned above, the signal to be measured can be filtered and amplified comparatively more effectively, so that ultimately a more precise measurement of the current is enabled.

Independently of the previously outlined improvements, it is favorable if an off on switch for opening the AC circuit is provided in parallel with the switch. In particular, a current bypassing the open switch via the secondary connection otherwise formed by the AC circuit can be avoided by means of such an on off switch.

In order to reliably avoid any DC components provided by the AC source which could falsify the measurement, it is advantageous if the AC source is connected to the other AC circuit via an inductive coupling. As a result, the DC components of the AC source are eliminated.

The device according to the invention is particularly suitable for measurement of a charging and discharge current of a battery, for example in motor vehicles, wherein the battery is connected to one of the connections of the switch, and a current generator, in particular an alternator, is connected to the other connection. In applications of this type, such as are conventional in the automotive sector, for example, the abovementioned problem of fluctuations in temperature is particularly noticeable and at the same time, owing to the dependence of such applications on the state of charge of the battery, it is critical to measure each discharge current which is still so low as accurately as possible.

It is furthermore advantageous in many cases if the switch has at least one insulated gate field effect transistor, in particular at least one MOSFET. This type of switch enables safe switching of currents even in the case of several amperes and also in hazardous environments. In addition, this type of switch is particularly suitable for use in the device according to the invention because it has a finite and adjustable internal resistance which is subject to large tolerances.

A measurement of the AC voltage component which is comparatively simple and can be implemented at low cost and is nevertheless precise can be achieved by virtue of the fact that the measuring circuit is connected to a processing unit, wherein the processing unit has a multiplier for modulating the AC voltage component with a periodic reference signal, wherein the frequency of the reference signal is substantially identical to the frequency of the alternating current generated by the AC source, and wherein the output of the multiplier is connected to a low pass filter or a plurality of series connected low pass filters. In the case of such a circuit, the peak voltage or amplitude of the AC voltage component is present at the output of the (last) low pass filter and can thus be used directly for determining the current to be measured. In addition, the amplitude thus obtained has a mathematical sign, owing to the phase angle between the reference signal and the AC voltage component which is taken into consideration, so that the present voltage is negative or positive, depending on the direction of current flow.

Particularly quick determination of the direction of current flow (positive or negative mathematical sign) is achieved if the reference signal is a square wave signal in the case of the measuring circuit just described. A square wave signal generates a quicker and greater deflection during modulation, which, for example in conjunction with a comparator connected downstream of the low pass filters, enables accelerated registration of changes in direction of current flow.

In order that the measurement of the AC voltage component provided by the AC source is not influenced by external alternating currents, it is advantageous if the frequency of the AC source is selected to be different than, in particular greater than, any frequency/frequencies superimposed on the current between the connections. This relates in particular to frequency components which can be superimposed on the current to be measured, for example owing to rectified AC voltages from a frequency of the electricity grid or owing to predictable speed ranges of a connected generator. Usually, for such components, a maximum frequency can be specified, so that the frequency of the AC source is advantageously selected with a certain spacing above this maximum frequency. Ideally, the spacing from any interference frequencies is great enough for a suitable band pass filter to be able to completely filter out said interference frequencies.

BRIEF DESCRIPTION OF THE SEVERAL VIEWS OF THE DRAWING

The invention will be explained in more detail below on the basis of particularly preferred exemplary embodiments, which do not represent any restriction to the invention, however, and with reference to the drawing, in which the following are specifically shown.

DESCRIPTION OF THE INVENTION

The designation of alternating currents and AC voltages is always done using lower case and upper case letters in the figures and the description of the figures below, wherein the lower case letters i and u represent an alternating current and an alternating voltage, respectively, and the upper case letters I and U represent the amplitude of the current and voltage, respectively, designated by the lower case letters. The assignment to circuit elements or nodes is performed on the basis of the indices of the letters. In the case of direct currents and direct voltages, no lower case letters are used, and the upper case letters in this case represent arithmetic means, which can be equated to the amplitude in the case of a perfect direct current or a perfect DC voltage.

Figure 1:
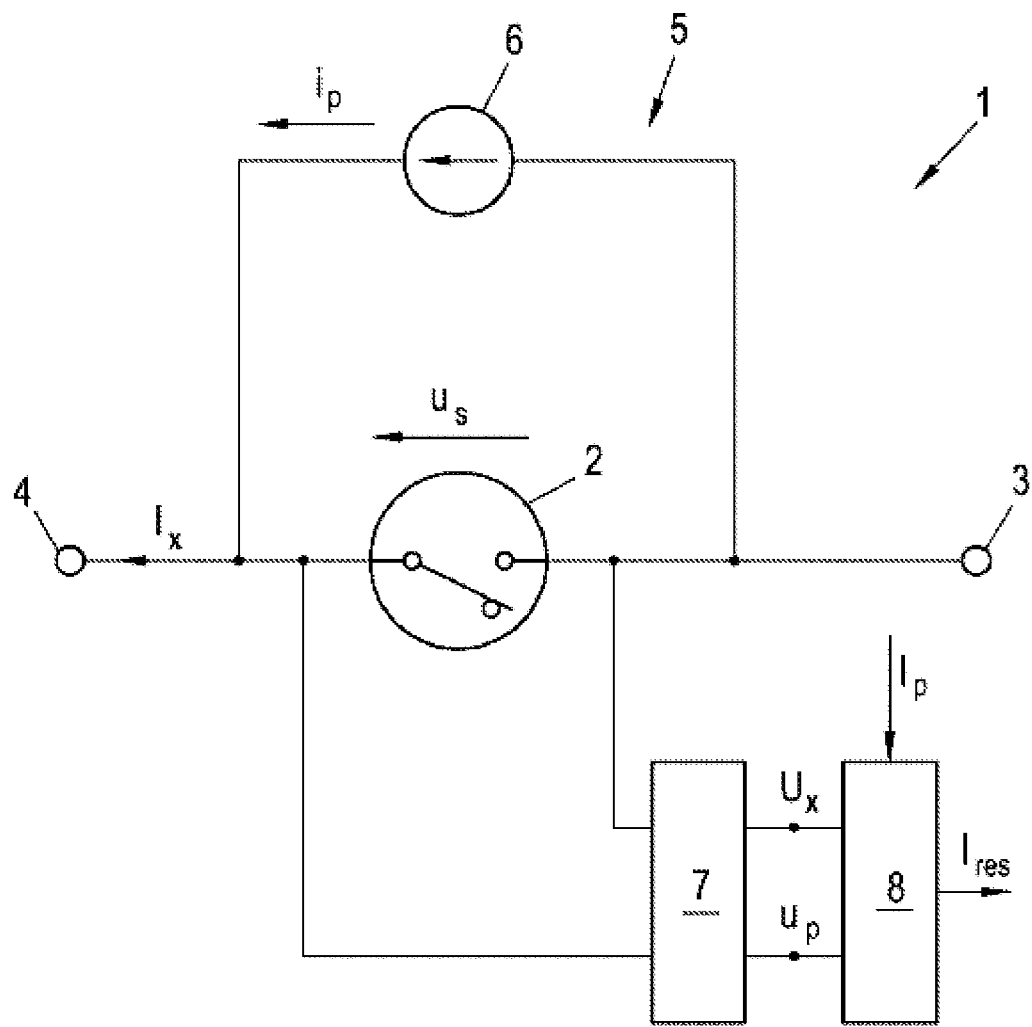
FIG. 1 shows a schematic block circuit diagram of a simple basic embodiment of a device for measuring the current through a switch with an unknown internal resistance.

The schematic block circuit diagram depicted in FIG. 1 shows a device 1 comprising a switch 2 and two connections 3, 4, which are connected via the switch 2. An AC circuit 5, which is closed via the switch 2, is connected in parallel with the switch 2. The alternating current $i_p$ in the AC circuit 5 is determined by an AC source 6, wherein the alternating current $i_p$ generated by the AC source 6, i.e. the amplitude $I_p$ and frequency $f_p$ of said alternating current, are known or predetermined. In addition, a measuring circuit 7 is connected on both sides to the switch 2, which measuring circuit is designed to determine the voltage $u_s$ present at the switch 2, wherein the determined total voltage $u_s$ or the profile over time thereof is divided into a DC voltage component $U_x$ and AC voltage component $u_p$. The switch 2 therefore operates as a measuring shunt, but with an unknown resistance $R_s$. In order to determine the current flowing between the connections 3, 4 or the mean $I_x$ thereof, the measuring circuit 7 is connected to a processing unit 8, which derives the desired current $I_x$ from the known parameter of the AC amplitude $I_p$ and from the measured voltage components $U_x$, $u_p$ or the amplitude $U_p$ of the AC voltage component $u_p$, to be precise in accordance with the following equation:

$$I_x = I_p \cdot \frac{U_x}{U_p}. \qquad (1)$$

Knowledge of the internal resistance $R_s$ of the switch 2 is in this case not required. Instead, the knowledge of the AC amplitude $I_p$ and the amplitude $U_p$ of the AC voltage component $u_p$ is sufficient, via which the switch internal resistance $R_s$ is implicitly determined. In this case, it is freely supposed that the internal resistance $R_s$ of the switch 2 is substantially purely resistive, i.e. the switch 2 has a negligibly low or no reactance. Owing to the substantially simultaneous measurement of the two voltage values $U_x$, $U_p$, the result is independent of any changes or fluctuations in the internal resistance $R_s$.

Figure 2:
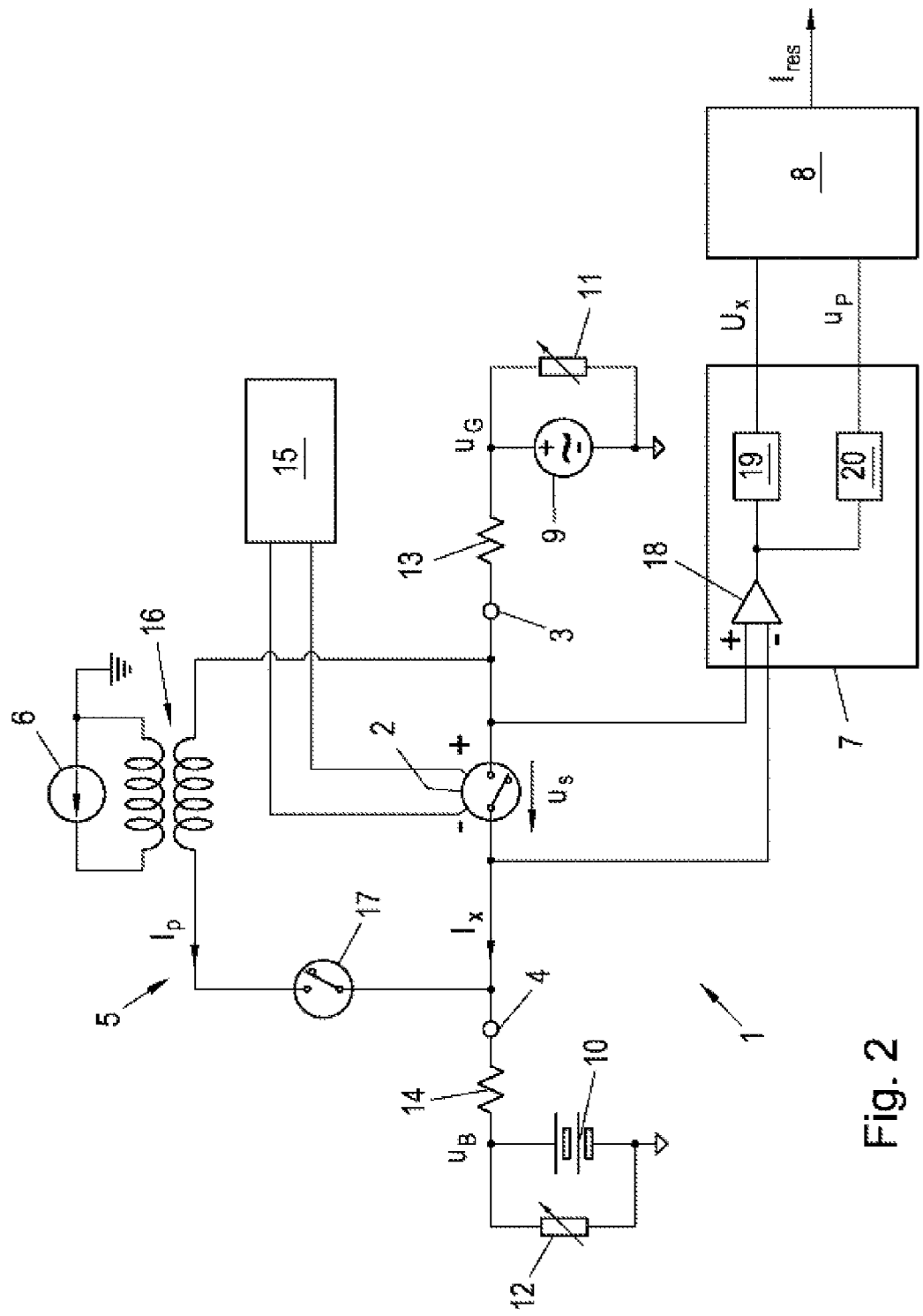
FIG. 2 shows a schematic block circuit diagram of a variant of the device according to the invention comprising a battery and a generator.

FIG. 2 shows a variant of the device 1, wherein a generator 9, which outputs a voltage $u_G$, is connected to one connection 3 and a rechargeable battery 10 is connected to the other connection 4. In each case variable local loads 11, 12 are connected both to the generator 9 and to the battery 10, so that only some of the generator or battery current flows via series impedances 13, 14 and the switch 2. The device 1 is intended for determining this partial current $I_x$. The switch 2 is connected to a control unit 15, for example a switching or gate signal generator 15. The control unit 15 determines the switch position or controls generally changes in the internal resistance $R_s$ of the switch 2.

The AC circuit 5 has an on off switch 17, which is designed to interrupt or open the AC circuit 5 independently of the switch 2. As can also be seen in FIG. 2, the AC source 6 is in this case connected to the actual AC circuit 5 via an inductive coupling 16. In this case, the on off switch 17 is particularly advantageous since it prevents any DC voltage components of the current $I_x$ to be measured from bypassing the switch 2 via the AC circuit 5 and the inductance 16.

In addition, FIG. 2 shows a simple design of the measuring circuit 7. In this case, the measuring circuit 7 comprises a differential amplifier 18, a low pass filter 19 and a band pass filter 20. The two filters 19, 20 are each connected to the output of the differential amplifier 18. The differential amplifier 18 is a simple means for eliminating absolute voltage fluctuations in the current $I_x$ and, if required, brings the voltage differences to be measured into the working range of the two filters 19, 20. In the variant illustrated in FIG. 3, by way of example a detailed design of the switch 2 and the gate signal generator 15 is shown. In this case, the switch 2 has two series connected semiconductor switches 21, 22, preferably MOSFETs. In order to change the internal resistance $R_s$ of the two semiconductor switches 21, 22, a gate voltage source 23 is connected between the source (or bulk) and the gate of both switches 21, 22. The voltage $u_g$ applied by the gate voltage source 23 therefore determines the internal resistance $R_s$ of the switch 2. In this case, the gate voltage source 23 is connected to a gate signal switch 24, which connects the gate voltage source 23 either to a pulsed gate signal generator 25 comprising a clock generator 26 or to a steady-state gate signal generator 27. Preferably at least two steady-state gate signal generators 27 can also be connected to the gate signal switch 24, so that a selection of two different constant internal resistances of the switch 2 is possible. If the gate voltage source 23 is connected to the pulsed gate signal generator 25, the gate voltage and therefore the internal resistance $R_s$ of the switch 2 oscillates corresponding to the pulsed signal. If the pulse frequency of the pulsed gate voltage source 25 substantially corresponds to the frequency of the alternating current, which is intended to be indicated by the connecting line 28, a substantially constant current $I_x$ (i.e. in the case of a switched off AC circuit 5) in an AC voltage component $U_p$ can result in the measuring circuit 7 because the filters 19, 20 of the measuring circuit 7 in this case filter out the signal generated by the modulated gate voltage from the remaining voltage fluctuations so that the determined AC voltage component $U_p$ is proportional to the change in resistance in the switch 2.

Figure 3:
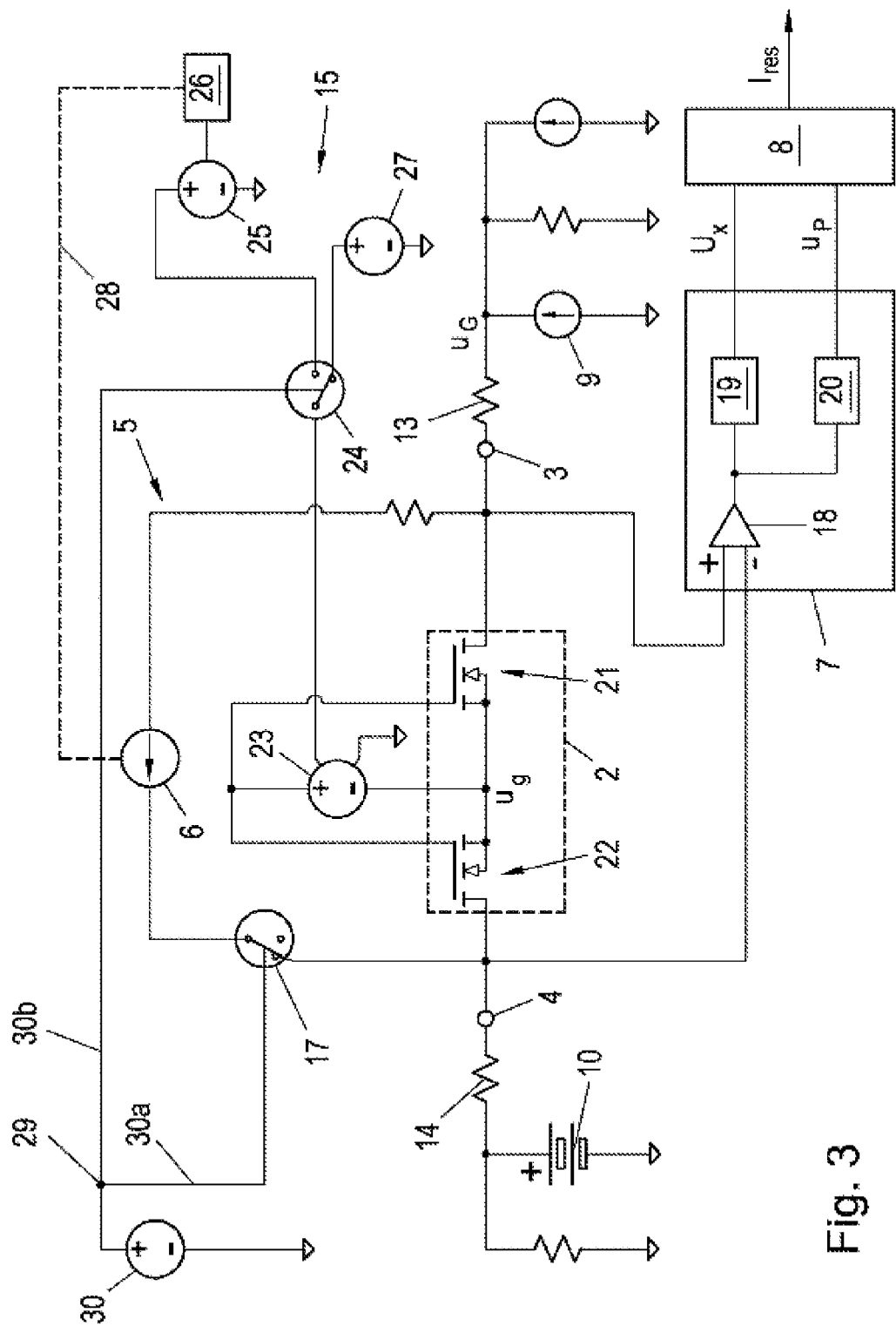
FIG. 3 shows a schematic block circuit diagram of a further variant of the device according to the invention comprising a switch having two MOSFETs.

As indicated by the linkage 29 in FIG. 3, it is advantageous to switch off the AC circuit 5 when using the pulsed gate signal generator 25. For this purpose, two positions are provided for the on off switch 17: in the first, closed position (depicted in FIG. 3), the AC circuit 5 passes via the switch 2 so that the alternating current $i_p$ is superimposed on the current $I_x$ to be measured; in the second, open position, the on off switch 17 disconnects the switch 2 from the AC circuit 5, so that only the current $I_x$ to be measured flows through the switch 2. The gate signal switch 24 and the on off switch 17 are both controlled by a common operation selection unit 30 for the purpose of simple synchronization in the example illustrated. The operation selection unit 30, which in practice is connected to a super ordinate sequence control system for the measurement, for example, switches over between an operating mode with a constant switch resistance (cf., for example, FIG. 6, interval between $t_0$ and $t_2$) and an operating mode with a periodically changing switch resistance (cf. FIG. 6, interval between $t_2$ and $t_x$). For this purpose, the operation selection unit 30 is connected to control inputs of the on off switch 17 and the gate signal switch 24 via control lines 30a, 30b, so that a signal output by the operation selection unit 30 (cf. FIG. 6g) simultaneously achieves either switching off of the AC circuit 5 and connection of the gate voltage source 23 to the pulsed gate signal generator 25 or switching on of the AC circuit 5 and connection of the gate voltage source 23 to the steady state gate signal generator 27.

Figure 4:
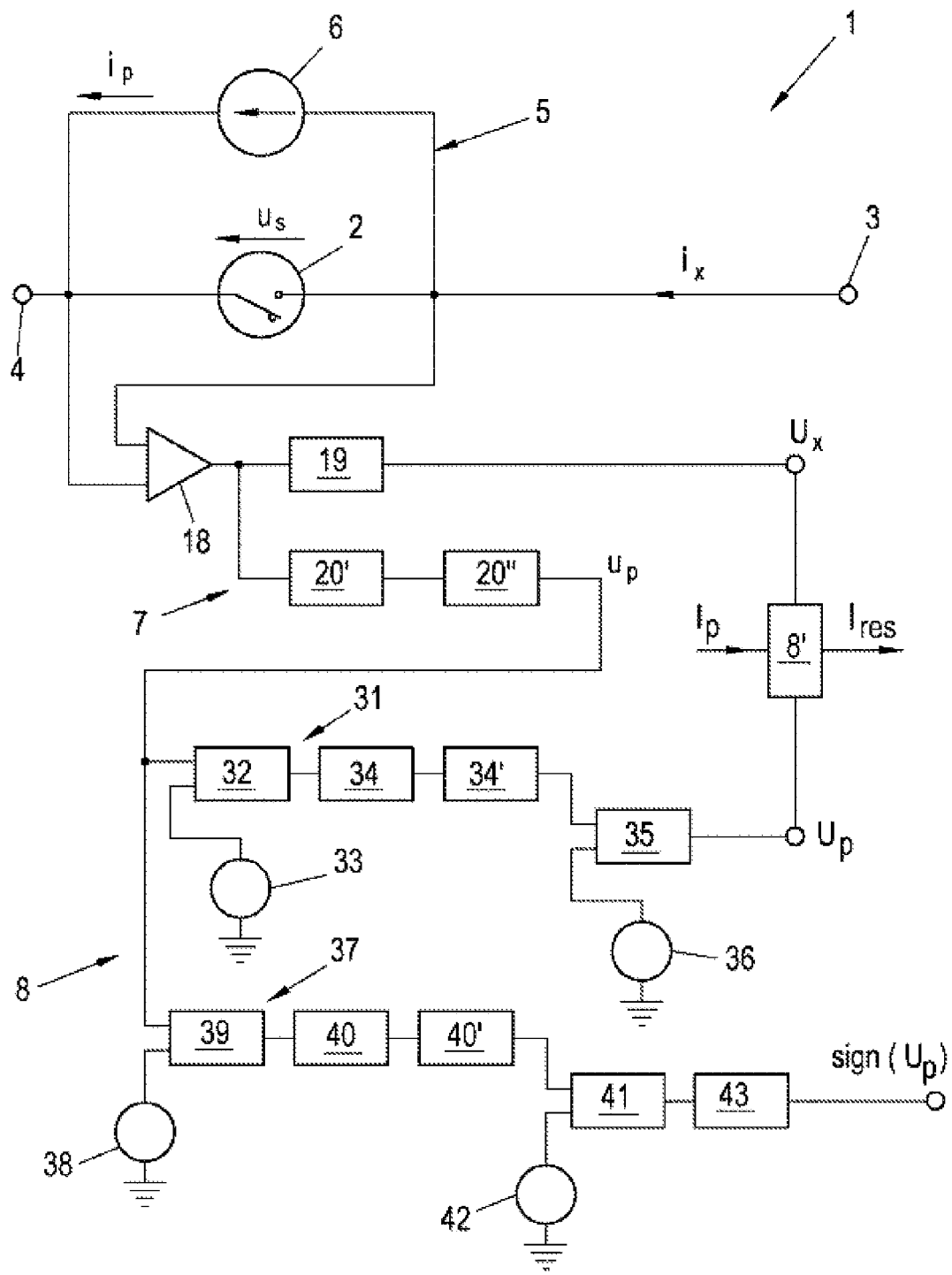
FIG. 4 shows a schematic block circuit diagram as shown in FIG. 1, but with a detailed illustration of the signal processing elements of the measuring circuit.

As already indicated in FIG. 1 by the processing unit 8, the device according to the invention can have a number of processing elements, wherein a preferred embodiment of part of the processing unit 18, in addition to the measuring circuit 7, is illustrated in more detail in FIG. 4. The basic elements of the device 1 which have already been discussed in detail above, namely the switch 2 with the connections 3, 4 and the AC circuit 5 together with the AC source 6, are illustrated in simplified form in FIG. 4 for easier orientation (cf. FIG. 1). Similarly to as in FIG. 2, a differential amplifier 18 is provided for determining and amplifying the voltage drop across the switch 2; a low pass filter 19 and, in parallel therewith, two series connected identical band pass filters 20', 20" are connected to the output of the differential amplifier 18. Therefore, an AC voltage $u_p$ corresponding to the AC voltage component of the voltage drop $u_s$ across the switch 2 is present at the output of the second band pass filter 20".

In order to determine the voltage quotient of the DC voltage component and the AC voltage component (see equation 1), it is necessary to determine the amplitude $U_p$ of the AC voltage $u_p$ as precisely as possible. This is achieved in the arrangement illustrated in FIG. 4 by a lock in amplifier circuit 31, wherein the AC voltage $u_p$ is modulated in a multiplier 32 with a reference signal from a signal generator 33. The reference signal is an AC voltage at the same frequency as that of the AC source 6 or the clock generator 26 of the gate signal generator 25. The signal modulated in this way then passes through, for example, two series connected low pass filters 34, 34' (if appropriate, a low pass filter of a higher order can also be used). Prior to being output, the voltage present at the second low pass filter 34' is multiplied by a constant gain voltage 36 for amplification in a further multiplier 35. Therefore, the amplitude or peak voltage $U_p$ of the AC voltage component $u_p$ is present at the output of the multiplier 35.

The amplitude $U_p$ obtained from the amplifier circuit 31 just described has a mathematical sign and therefore allows conclusions to be drawn in respect of the direction of current flow of the current $I_x$ to be measured.

If the current $I_x$ is very low, and in particular when the direction of current flow needs to be established very quickly, the identification on the basis of the amplitude $U_p$ of the AC voltage $u_p$ is insufficient, however, since the signal to noise ratio becomes too small or the time constant of the low pass filter has an unfavorable effect. In FIG. 4, therefore, an additional, slightly modified amplifier circuit 37 is provided in parallel with the amplifier circuit 31 for quick and clear determination of the direction of current flow. This circuit 37, which is again in the form of a lock in amplifier, in this case uses a square-wave reference signal, which is generated by a square wave signal generator 38. In turn, two series connected low pass filters 40, 40' are connected to the output of a multiplier 39, to which the AC voltage $u_p$ and the reference signal are supplied. The voltage present at the output of the second low pass filter 40' is then amplified in a further multiplier 41 with a higher gain voltage 42 than previously described. The multiplier 41 is finally connected to a discriminator 43, which outputs a two value directional signal sign($U_p$), which can be used for the quick identification of the direction of current flow.

In order to calculate the result $I_{res}$ of the current measurement, a calculation unit 8', which is likewise part of the processing unit 8, forms the quotient of the voltage amplitudes $U_x$ and $U_p$ and multiplies this quotient by the known amplitude $I_p$ of the alternating current $i_p$.

Figure 5A:
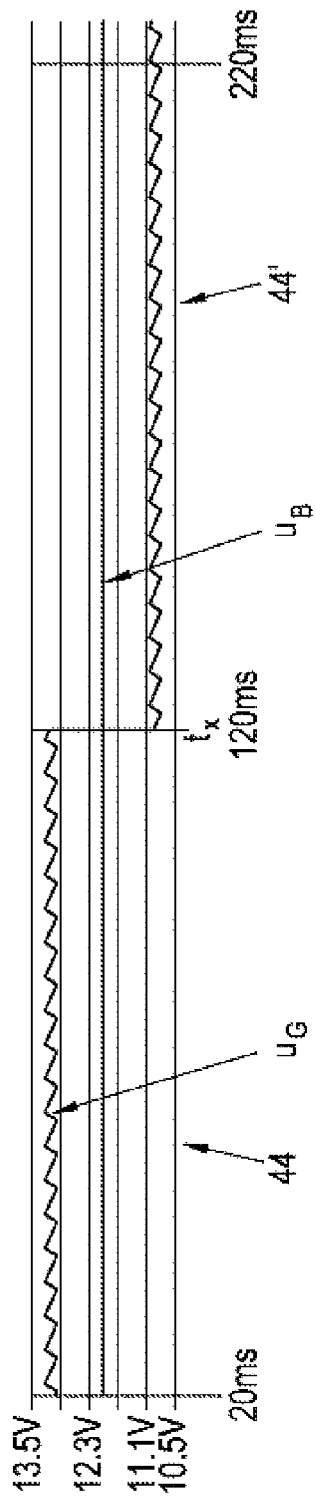
FIG. 5 shows a group of signal profiles for illustrating the method according to the invention.

The basic mode of operation of the present invention will be explained in detail with reference to the time sequence illustrated in FIG. 5. The figure comprises seven lines or plots a)-g) of time curves of different parameters of the device or of signal profiles which have been determined on the basis of a circuit simulation. FIG. 5a shows the voltage profile at the two connections 3, 4. The voltage $u_G$ at the first connection 3, which is -tooth fashion at a specific generator frequency $f_G$. These voltage fluctuations are often referred to as ripple (the term used below), which is characterized by a ripple frequency $f_R$ and a ripple amplitude $A_R$. The voltage $u_B$ at the second connection 4, which is connected to a battery 10, for example, on the other hand, is substantially constant, which is represented by the continuous line. During a first time segment 44, the voltage $u_G$ at the first connection 3 is higher than the voltage $u_B$ at the second connection 4, with the result that a current $I_x$ flows from the first connection 3 to the second connection 4. This current $I_x$ is plotted in FIG. 5b, wherein the profile of the current $I_x$ is determined by the voltage difference ($u_G$−$u_B$) and therefore has the same structure as the voltage $u_G$ at the first connection 3. At a time $t_x$, the voltage ratios are reversed and the voltage $u_B$ at the second connection 4 now exceeds the voltage $u_g$ at the first connection 3. Accordingly, the direction of current flow also changes, which is illustrated by a change of mathematical sign in the second time segment 44' in FIG. 5b. FIG. 5c shows, parallel to FIGS. 5a and 5b, the time profile of the DC voltage component $U_x$, i.e. the mean of the voltage drop $u_s$ across the switch 2 ($U_x$=avg($u_s$)). The averaging in this case takes place in a low pass filter 19, as a result of which the voltage fluctuations shown in FIG. 5a are smoothed. However, the low pass filter 19 causes a delay 45 in the case of voltage changes, for example in the case of a change at time $t_x$, so that the average voltage only converges towards the present mean value or the DC voltage component $U_x$ after a transition period 45.

Figure 5B:
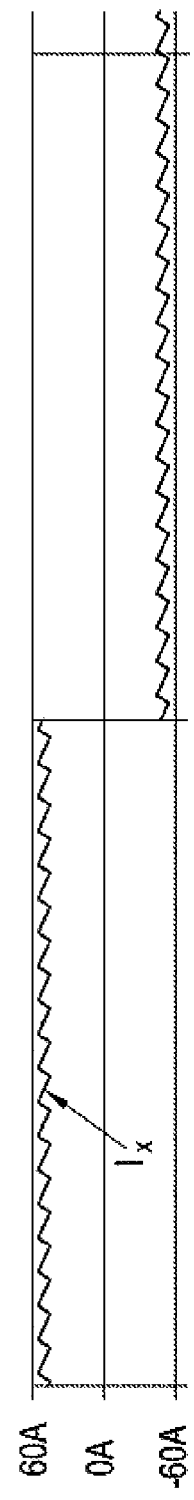
Figure 5C:
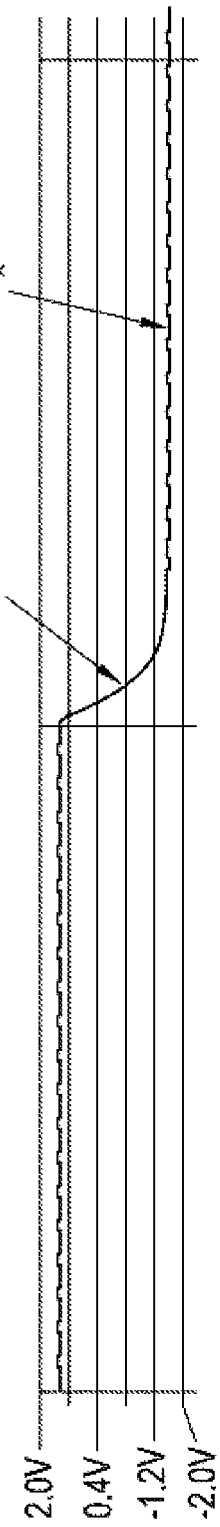

As already explained many times above, an alternating current $i_p$ from a dedicated AC source 6 is superimposed on the current $I_x$ to be measured, whose profile is shown in FIG. 5b. The total current flowing through the switch 2 as a result ($i_3$=$I_x$+$i_p$) changes the voltage drop $u_s$ across the switch 2. FIG. 5d shows the AC voltage component $u_p$ of such a superimposition. The frequency $f_p$ of the superimposed alternating current $i_p$ in this example is approximately five times the ripple frequency $f_R$. The visible discrepancy between the AC voltage component $u_p$ and a uniform oscillation is caused by the ripple in the current $I_x$ (cf. FIG. 5a). Since the voltage fluctuations owing to the ripple are approximately of the same order of magnitude as the AC voltage brought about by the AC source 6, the discrepancies are clearly identifiable.

FIG. 5e shows the profile of the gate voltage $u_g$. The continuous line corresponds to a constant gate voltage $U_g$ and consequently a substantially constant internal resistance $R_s$ of the switch 2, which in the example has a MOSFET, comparable to the device illustrated in FIG. 3. This corresponds to a gate voltage source 23 controlled by a steady-state gate signal generator 27.

The profile over time of the amplitude $U_p$ of the AC voltage component $u_p$ illustrated in FIG. 5d is shown in FIG. 5f. This amplitude $U_p$ can be determined, for example, by the device 1 shown in FIG. 4. Despite the low pass filter 34, 34' used, in this case "remainder" of the current ripple furthermore takes effect, so that the amplitude $U_p$ illustrated is slightly falsified in comparison with the actual constant amplitude of the alternating current $i_p$ generated by the AC source 6. In a manner comparable to the low pass filter 19 for voltage averaging, the low-pass filters 34, 34' used here also cause a delay 46 during switchover of the direction of current flow of the current $I_x$. Directly after the switchover time $t_x$, the amplitude $U_p$ decreases significantly and only diverges back to the same more or less stable profile prior to switchover after a transition period 46.

Taking into consideration the gains used during the signal processing, the current $I_x$ flowing via the switch 2 can be calculated, in accordance with the above cited equation (1), from the illustrated signal profiles for the DC voltage component $U_x$ and the AC voltage $u_p$ or the amplitude $U_p$ thereof. The time profile of the result $I_{res}$ of this calculation is illustrated in FIG. 5g, wherein it should be emphasized that the value of the internal resistance $R_s$ of the switch 2 has not explicitly been used for the calculation $I_{res}$ of the desired current $I_x$ (i.e. $I_{res}$=$I_x$). The multiple filtering of the signals effects a delay during the switchover of the direction of current flow and distorts the form of the ripple, but otherwise substantially correctly reproduces the profile of the current $I_x$.

If the current $I_x$ becomes small, the measurement error increases. In order to improve the accuracy and resolution, therefore, it is possible to convert to a multi step method when a certain measured current is undershot. FIG. 6 illustrates in this connection the signal profiles in the case of an improved three step method. In this case, it is assumed that the internal resistance $R_s$ of the switch 2 is unknown, but is controllable in a targeted manner and in particular a periodic change in resistance is possible (cf. FIG. 3).

Figure 6A:
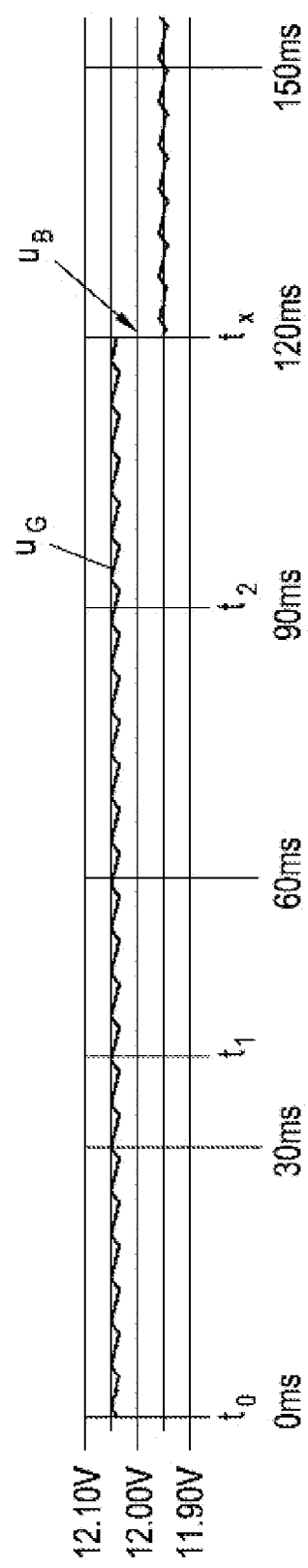
FIG. 6 shows another group of signal profiles for illustrating a further variant of the method according to the invention.
Figure 6B:
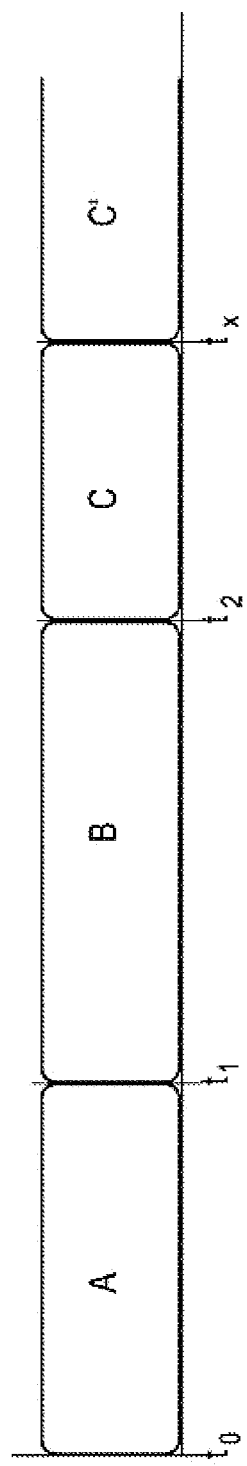
Figure 6C:
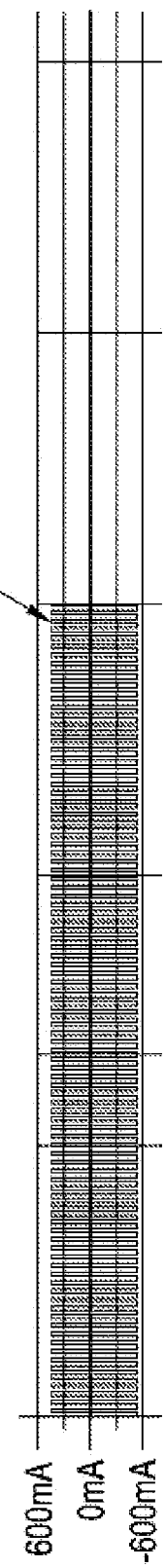
Figure 6D:
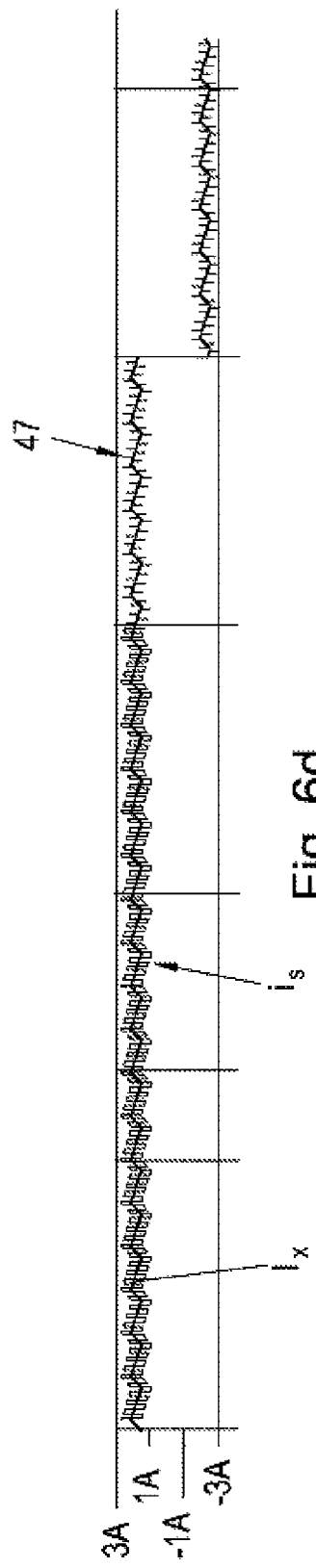
Figure 6E:
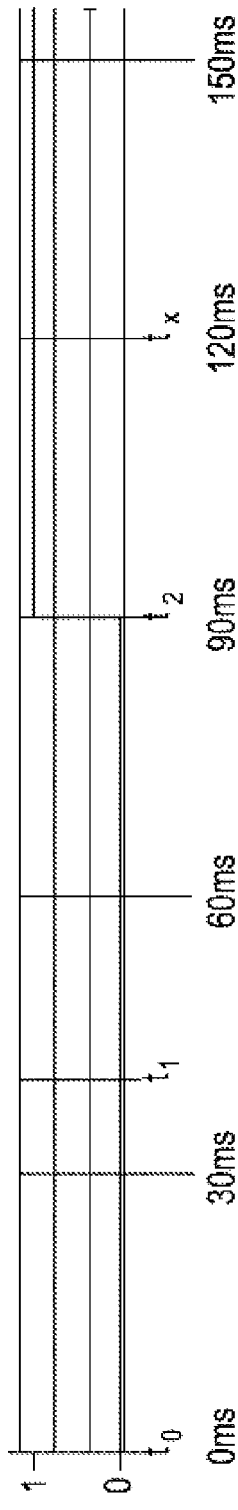
Figure 6F:
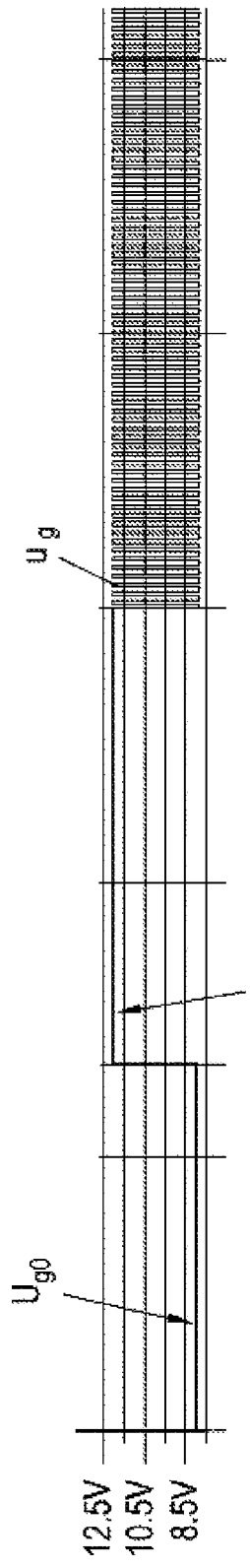
Figure 6G:
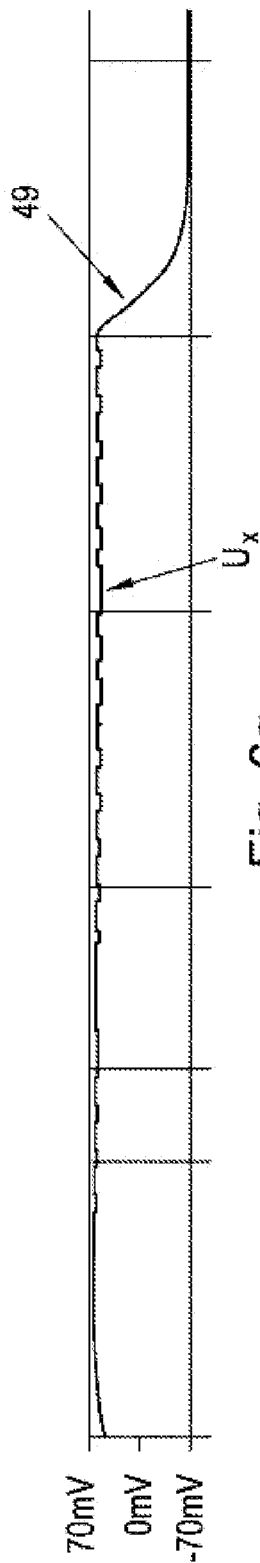
Figure 6H:
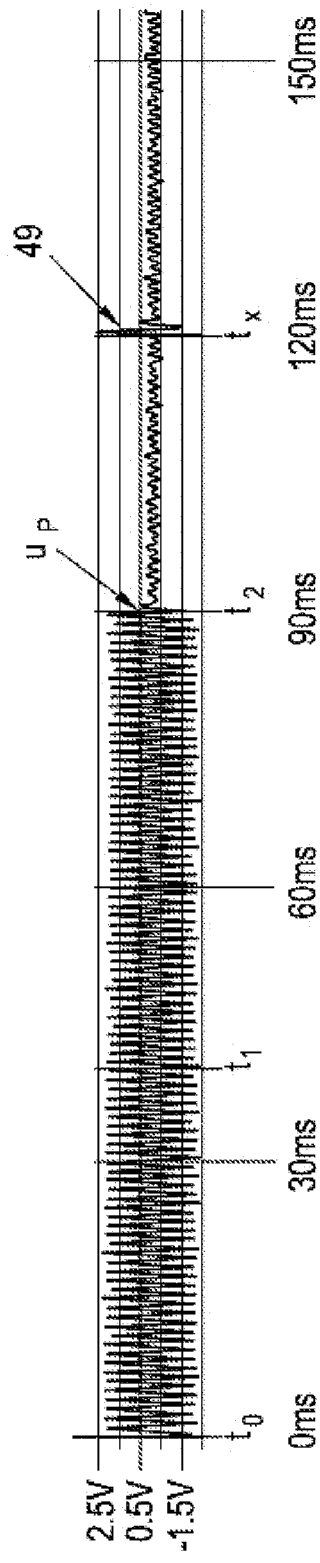

In FIG. 6, FIG. 6a shows in detail the voltage $u_G$, $u_B$ at the two connections 3, 4 of the present device 1; FIG. 6b illustrates schematically the time sequence of the three step method in this example, wherein the first step corresponds to the segment A between $t_0$ and $t_1$, the second step corresponds to the segment B between $t_1$ and $t_2$, and the third step corresponds to the segment C between $t_2$ and $t_x$. The following section C', i.e. the one beginning at time $t_x$, differs from segment C in terms of a change in the measured variable (cf. FIG. 6a), but not the measurement procedure; FIG. 6c shows the profile of the alternating current $i_p$ in the AC circuit 5; FIG. 6d shows both the current $I_x$ to be measured and the total current $i_s$ which flows via the switch 2; FIG. 6e shows the state of an operation selection unit 30 (cf. FIG. 3); FIG. 6f illustrates the profile of the gate voltage $u_g$ at the switch 2; FIG. 6g and FIG. 6h illustrate the DC voltage component $U_x$ of the voltage drop across the switch and the AC voltage $u_p$, respectively, and FIG. 6i shows the determined amplitude $U_p$ of the AC voltage $u_p$.

The three steps or segments A, B, C of the method illustrated here are run through successively, wherein the order is not critical. At time $t_x$, the direction of the current $I_x$ is reversed (cf. FIG. 6a). Any other desired order can be selected. More important than the order is the proximity in time of the steps since the method sequence is favorably quick in comparison with any changes in the environment parameters. In the plots shown in FIG. 6, the first step A is depicted between times $t_0$ and $t_1$ (with the time being plotted on the x axis), the second step B is depicted between $t_1$ and $t_2$, and the third step C is depicted between $t_2$ and $t_x$. The current $I_x$ flowing between the connections 3, 4 is substantially identical during the entire procedure, from $t_0$ to $t_x$ (cf. FIG. 6a), apart from a ripple. The first two steps (between $t_0$ and $t_2$) differ from the third step (between $t_2$ and $t_x$) in particular in that the AC source 6 is inactive during the third step. Therefore, there is no current flowing in the AC circuit 5 between times $t_2$ and $t_x$ ($i_p$=0).

During the first two steps, two different gate voltages $U_{g0}$, $U_{g1}$ (cf. FIG. 6f) are applied to the switch 2. The two gate voltages effect two different internal resistances $R_{s0}$ and $R_{s1}$ of the switch 2, which results in corresponding changes in the AC voltage $u_p$. The change (cf. FIGS. 6h and 6i) consists in that the amplitude $U_p$ of the AC voltage $u_p$ is slightly lower during the second step B than during the first step A since the second switch internal resistance $R_{s1}$ is lower than the first switch internal resistance $R_{s0}$. Owing to the fact that the alternating current $i_p$ or the amplitude $I_p$ thereof in this example is greater than the current $I_x$ between the connections 3, 4, the AC voltage $u_p$ is dominated by the influence of the AC source 6 during the first two method steps, i.e. discrepancies from the uniformly periodic profile are barely identifiable. The effects of the square wave alternating current $i_p$ are also demonstrated in the current $i_s$ flowing via the switch (cf. FIG. 6d), wherein a rectangular component is superimposed on the current $I_x$ with a ripple with a saw tooth waveform. During these two steps, in particular the amplitudes $U_{p0}$ and $U_{p1}$ of the AC voltage component $u_p$ which are measured during the first step and the second step, respectively, or actually the difference between said amplitudes, i.e. the change $\Delta U_p = U_{p0} - U_{p1}$ in the amplitude $U_p$ of the AC voltage component $u_p$ in the event of a change in the gate voltage $u_g$ at the switch 2, are relevant for the present measurement.

During the third step C, the AC source 6 is completely deactivated, and possibly the AC circuit 5 is opened, so that only the current $I_x$ to be measured flows via the switch 2. In addition, the gate voltage source 23 is now connected to a periodic gate signal generator 25, so that the gate voltage $u_g$ and therefore the internal resistance $R_s$ of the switch 2 are switched over periodically between values $R_{s0}$ and $R_{s1}$, which are assumed during the two proceeding steps. The internal resistance $R_s$ of the switch 2 still does not need to be known at any point, however. The switch 2 should be suitable for following the frequency of the changing gate voltage $u_g$ so that the resistances achieved in the case of a periodic change substantially correspond to the constant resistances $R_{s0}$ and $R_{s1}$ during the first two method steps. The AC frequency of the gate voltage $u_g$ is advantageously equal to the frequency $f_p$ of the alternating current $i_p$ generated by the AC source 6 during the first two steps A, B, so that the AC voltage $u_p$ generated by variation in the resistance (given the same current $I_x$) can be processed by the same filters as the previously superimposed alternating current $i_p$. Owing to the changing switch internal resistance $R_s$, the AC voltage component $U_p$ determined by the measuring circuit 7 is not zero, as the switched-off AC source 6 would have us suppose, but corresponds to the AC voltage drop $u_p$ across the switch 2 in the case of a preset current $I_x$ and changing resistance $R_s$ (cf. FIG. 6h between $t_2$ and $t_x$). A valid estimation of the AC voltage component $U_{p2}$ only adjusts itself after a short settle time 48 once the AC source 6 has been switched off at time $t_2$, for reasons which have already been mentioned several times. The amplitude $U_{p2}$ of the AC voltage component $u_p$ then determined corresponds to the change in voltage $\Delta U_x$ given a constant current $I_x$ ($\Delta U_x = U_{p2}$) and a changing resistance. The desired current $I_x$ can now be calculated from this change in voltage $\Delta U_x$ and the change $\Delta U_p$ in the amplitude of the AC voltage component given an active AC source 6 and different constant gate voltages $U_{g0}$, $U_{g1}$ and therefore different switch resistances $R_{s0}$ and $R_{s1}$, in accordance with the following equation:

$$I_x = I_p \cdot \frac{\Delta U_x}{\Delta U_p}, \qquad (2)$$

where $$\Delta U_x = I_x \cdot R_{s0} - I_x \cdot R_{s1} \text{ and } \Delta U_p = U_{p0} - U_{p1} = I_p \cdot R_{s0} - I_p \cdot R_{s1} \qquad (3).$$

Figure 6I:
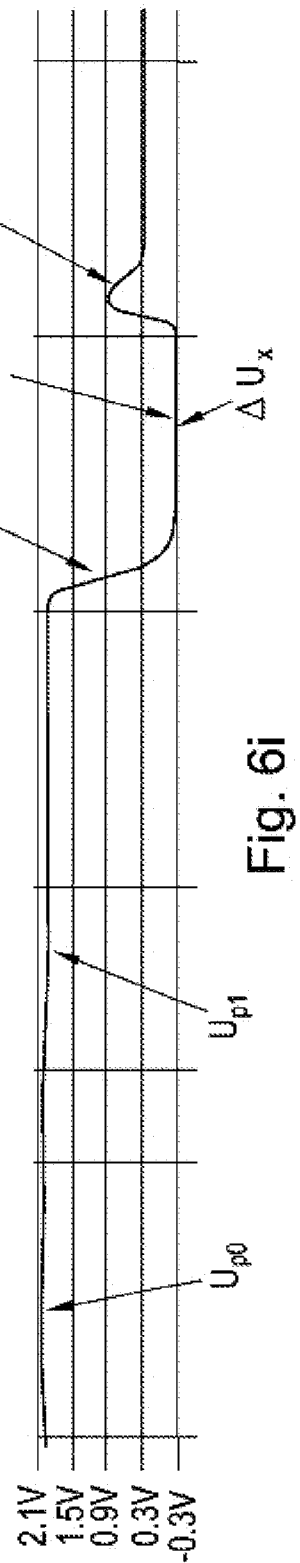
Figure 7A:
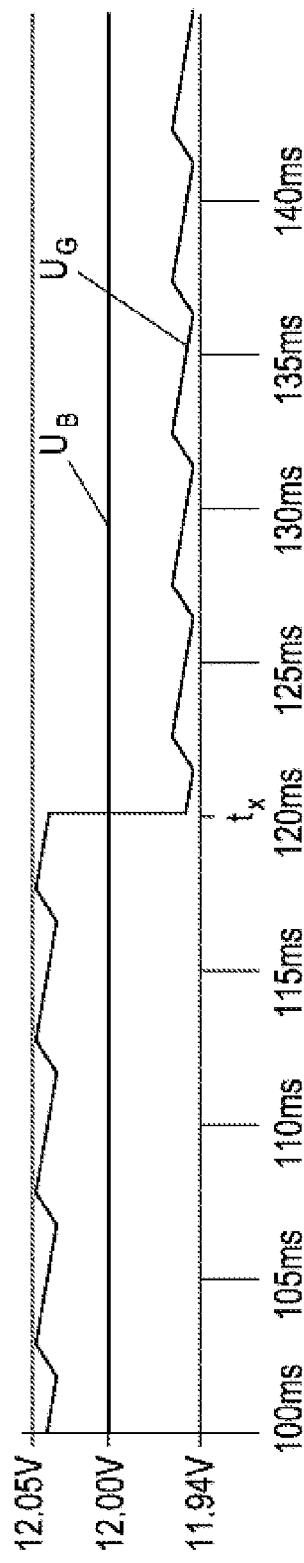
FIG. 7 shows a further group of signal profiles for illustrating a variant of the method according to the invention for determining the direction of current flow.
Figure 7B:
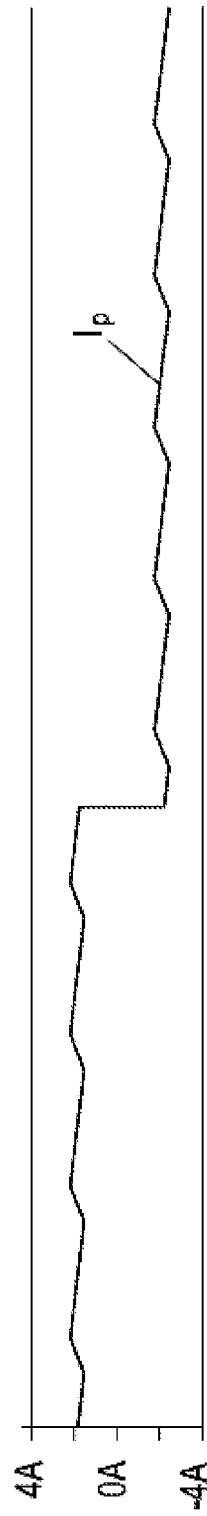
Figure 7C:
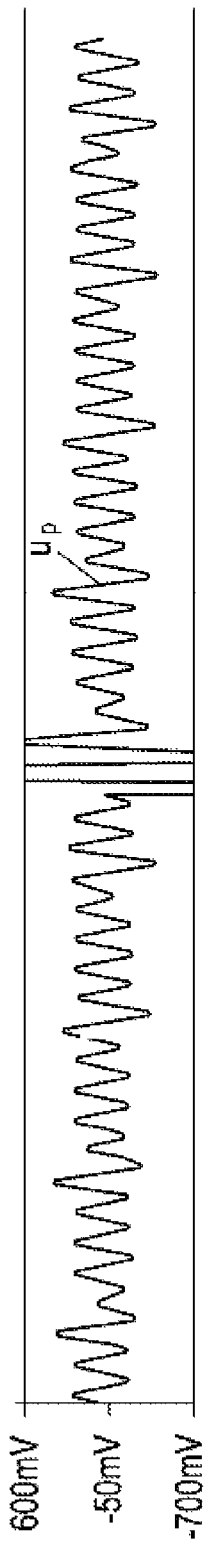
Figure 7D:
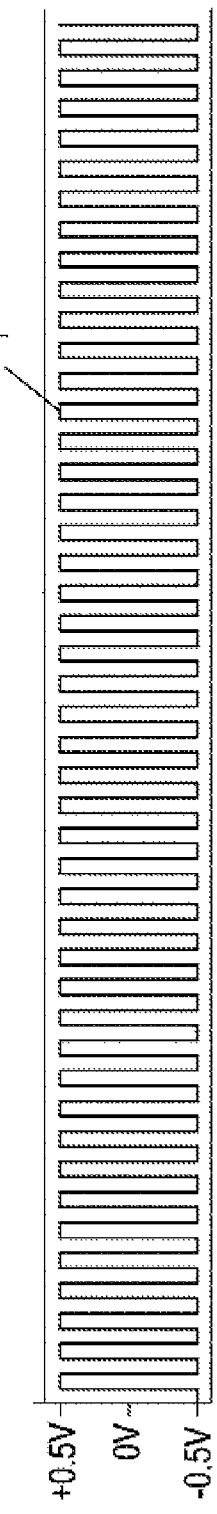
Figure 7E:
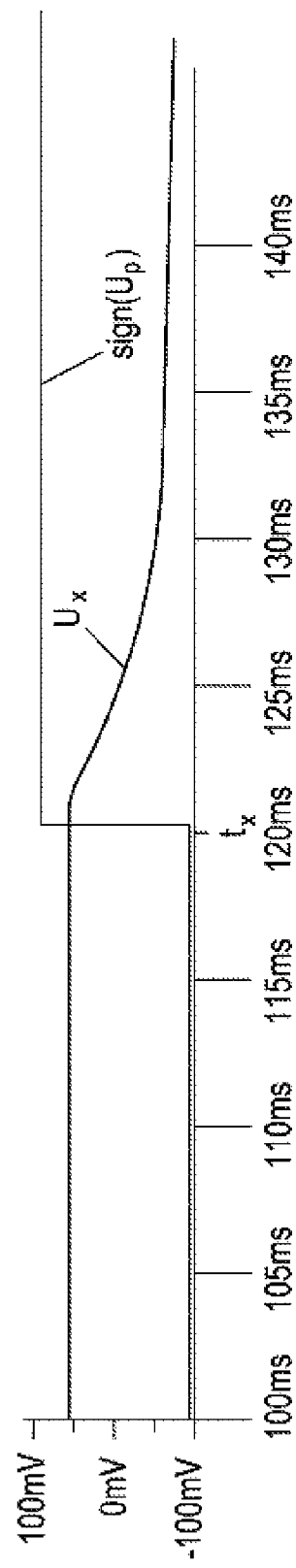

As can be seen from FIG. 6a, the current $I_x$ remains uninfluenced by the AC source 6 during the third step C. Temporary current peaks 47 are generated, if indirectly, by the changing internal resistance $R_s$: during switchover from the greater resistance $R_{s0}$ to the lower resistance $R_{s1}$, a current peak pointing upwards, toward the higher current values, can be seen and in the case of switchover from the lower resistance $R_{s1}$ to the higher resistance $R_{s0}$, a current peak pointing downwards toward the lower current values can be seen. At time $t_x$, i.e. in this example after the third and final method step C and at the beginning of the segment C', the direction of the current $I_x$ also changes in the profile illustrated in FIG. 6. An immediate re measurement with the two constant gate voltages $U_{g0}$, $U_{g1}$ is not absolutely necessary, however. Even during switchover of the direction of current flow, the device according to the invention requires a short settle period 49, in particular as regards the DC voltage component $U_x$ (FIG. 6g) and the amplitude $U_p$ of the AC voltage component $u_p$ (FIG. 6i). In this case, a short-term overshoot may occur, which can be attributed to the energy which is usually stored in the low-pass filters. If the duration of the settle period 49 is acceptable for the respective application, the determination of the DC voltage component $U_x$ is sufficient for identifying the direction of current flow.

The signal profiles shown in FIG. 7 illustrate a variant of the method according to the invention which enables comparatively quick identification of the direction of current flow or of a change in the direction of current flow. The illustrated situation corresponds approximately to the transition between segments C and C' in FIG. 6 (cf. FIG. 6b) with the change in direction of current flow at time $t_x$. In this case, FIG. 7a shows in detail the voltage $u_G$, $u_B$ at the two connections 3, 4 of the present device 1; FIG. 7b shows the current $I_x$, whose direction is to be determined; FIG. 7c shows the AC voltage $u_p$; FIG. 7d illustrates the profile of a reference voltage $u_r$, whose form, frequency $f_p$ and phase angle corresponds to the gate voltage $u_g$ at the switch 2 (cf. FIG. 6f); and FIG. 7e illustrates both the DC voltage component $U_x$ of the voltage drop across the switch and the directional signal sign($U_p$) (cf. FIG. 4).

As already explained in connection with the amplifier circuit 37 (cf. FIG. 4), the AC voltage $u_p$ is multiplied by a preferably rectangular reference signal $u_r$ for directional determination. Owing to the abruptly changed phase angle of the AC voltage $u_p$ at time $t_x$ (cf. FIG. 7c), the product of the AC voltage $u_p$ and the (unchanged) reference signal $u_r$ changes the mathematical sign already within the first half-cycle of the two signals (i.e. the reference signal $u_r$ and the AC voltage $u_p$), but in any case much more quickly than the DC voltage component $U_x$ likewise illustrated in FIG. 7e. The rate of change of the DC voltage component $U_x$ is preset by the time constant of the low-pass filter.

The relative phase angle between the AC voltage $u_p$ and the reference signal $u_r$ prior to and after the change in direction of current flow at time $t_x$ can be read at the dashed auxiliary lines in FIG. 7. The reversed mathematical sign of the directional signal sign ($U_p$) in comparison with the DC voltage component $U_x$ results from the phase equality of the gate voltage $u_g$ and the reference signal $u_r$. For simpler utilization, in practice the directional signal can be output in inverted form or alternatively a phase shift of 180° can be provided between the gate voltage and the reference signal.

The invention claimed is:

1. A method for measuring a current through a semiconductor switch having an unknown internal resistance, the switch having two connections, the method comprising:
   providing an AC source as part of an AC circuit connected in parallel with the switch, wherein both an amplitude and a frequency of a current provided by the AC source are known;
   during an operation, superimposing the current provided by the AC source on a current through the switch to be measured;
   determining an AC voltage component of a voltage difference across the switch and an amplitude thereof as a maximum voltage value;
   connecting a gate signal generator for controlling the switch resistance to the switch;
   interrupting the current provided by the AC source, periodically modulating the switch resistance by the gate signal generator, and determining a further AC voltage component of the voltage difference, wherein the current between the connections is determined proportionally to a product of the amplitude of the current of the AC source and the further AC voltage component;
   a) selecting a first setting of the switch resistance;
   b) determining a first AC voltage component of the voltage difference;
   c) selecting a second setting of the switch resistance;
   d) determining a second AC voltage component of the voltage difference;
   e) deactivating the AC source;
   f) periodically switching over the switch resistance between the first and second settings, corresponding to a square wave signal, by the gate signal generator;
   g) determining a third AC voltage component of the voltage difference;
   h) determining and outputting the current between the connections from a maximum current of the AC source and a ratio of the third AC voltage component and a difference between the first and second AC voltage components.

2. The method according to claim 1, which comprises, in addition to the AC voltage component, determining a DC voltage value of the voltage difference, and determining and outputting the current between the connections from the amplitude of the current of the AC source and a ratio of the determined voltage values.

3. The method according to claim 1, which comprises multiplying an AC voltage component of the voltage difference, which AC voltage component is brought about either by superimposing an alternating current or by modulation of the switch resistance, by a reference signal, and determining and outputting a direction of current flow on the basis of the mathematical sign of the product signal.

4. The method according to claim 1, which comprises changing the frequency of the AC source and optionally of the gate signal generator as soon as unfavorable frequency components are identified in the current between the connections.

5. The method according to claim 1, which comprises turning off the switch when the determined current is greater than a predetermined limit value.

6. A device for measuring a current through a semiconductor switch having an unknown internal resistance, the switch having two connections, the device comprising:
   an AC circuit including an AC source configured to provide an alternating current with a known amplitude and at a known frequency and connected in parallel with the switch, wherein, during operation, the alternating current is superimposed on the current through the switch to be measured;
   a gate signal generator for controlling the switch resistance connected to the switch; and
   a measuring circuit for determining an AC voltage component of a voltage present at the switch, said measuring circuit being configured for interrupting a current provided by the AC source, periodically modulating the switch resistance by the gate signal generator, and determining a further AC voltage component of the voltage difference, wherein the current through the switch is determined proportionally to a product of the amplitude of the current of the AC source and the further AC voltage component;
   a) selecting a first setting of the switch resistance;
   b) determining a first AC voltage component of the voltage difference;
   c) selecting a second setting of the switch resistance;
   d) determining a second AC voltage component of the voltage difference;
   e) deactivating the AC source;
   f) periodically switching over the switch resistance between the first and second settings, corresponding to a square wave signal, by the gate signal generator;
   g) determining a third AC voltage component of the voltage difference;
   h) determining and outputting the current between the connections from a maximum current of the AC source and a ratio of the third AC voltage component and a difference between the first and second AC voltage components.

7. The device according to claim 6 configured for carrying out the method according to claim 1.

8. The device according to claim 6, wherein said measuring circuit has at least one band pass filter for determining an AC voltage component of the voltage present at the switch.

9. The device according to claim 6, wherein said measuring circuit is configured to determine a DC voltage component of the voltage present at the switch.

10. The device according to claim 9, wherein said measuring circuit has at least one low-pass filter for determining a DC voltage component of the voltage present at the switch.

11. The device according to claim 6, wherein said measuring circuit has a differential amplifier for amplifying the voltage present at the switch.

12. The device according to claim 6, wherein said gate signal generator has a gate voltage switch having at least two switching states, wherein a different switch resistance is assigned to each switching state.

13. The device according to claim 6, wherein said gate signal generator has a clock generator for time controlled, periodic switching over between at least two different gate voltages.

14. The device according to claim 6, which comprises an on/off switch for opening the AC circuit.

15. The device according to claim 6, which comprises an inductive coupling connecting said AC source in said AC circuit.

16. The device according to claim 6, wherein a battery is connected to one of the connections of the switch and a current generator, is connected to the other connection.

17. The device according to claim 6, wherein the switch has at least one insulated gate field effect transistor.

18. The device according to claim 6, which comprises a processing unit connected to said measuring circuit, said processing unit has a multiplier for modulating the AC voltage component with a periodic reference signal, wherein a frequency of the reference signal is substantially identical to the frequency of the alternating current generated by said AC source, and wherein an output of said multiplier is connected to a low pass filter or a plurality of series connected low pass filters.

19. The device according to claim 18, wherein the reference signal is a square wave signal.

20. The device according to claim 6, wherein the frequency of the AC source is selected to be different from any frequency/frequencies superimposed on the current between the connections.

* * * * *